(12) United States Patent
Kitabayashi

(10) Patent No.: US 8,306,073 B2
(45) Date of Patent: Nov. 6, 2012

(54) FIBER LASER DEVICE

(75) Inventor: Tomoharu Kitabayashi, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 13/197,922

(22) Filed: Aug. 4, 2011

(65) Prior Publication Data

US 2011/0286475 A1 Nov. 24, 2011

Related U.S. Application Data

(63) Continuation of application No. PCT/JP2010/065065, filed on Sep. 2, 2010.

(30) Foreign Application Priority Data

Sep. 4, 2009 (JP) ................................. 2009-205197

(51) Int. Cl.
*H01S 3/30* (2006.01)
(52) U.S. Cl. ............. 372/6; 359/341.1; 385/12; 385/38; 385/123; 385/124; 385/125; 385/126; 385/127; 385/128; 385/141
(58) Field of Classification Search ........ 372/6; 385/12, 385/38, 123, 124, 125, 126, 127, 128, 141; 359/41.1, 41.13
See application file for complete search history.

(56) References Cited

U.S. PATENT DOCUMENTS

| | | | | |
|---|---|---|---|---|
| 6,167,075 | A * | 12/2000 | Craig et al. | 372/75 |
| 7,940,815 | B2 * | 5/2011 | Kakui et al. | 372/6 |
| 2004/0196882 | A1 | 10/2004 | Nakaji et al. | |
| 2005/0180474 | A1 * | 8/2005 | Buchold et al. | 372/38.08 |
| 2006/0146398 | A1 * | 7/2006 | Aozasa et al. | 359/341.1 |
| 2010/0246207 | A1 * | 9/2010 | Furuya et al. | 362/553 |
| 2010/0284428 | A1 * | 11/2010 | Furuya et al. | 372/6 |
| 2011/0069723 | A1 * | 3/2011 | Dong et al. | 372/6 |
| 2011/0305250 | A1 * | 12/2011 | Chann et al. | 372/6 |

FOREIGN PATENT DOCUMENTS

| | | |
|---|---|---|
| JP | 2000-228549 A | 8/2000 |
| JP | 2002-182043 A | 6/2002 |
| JP | 2004-319978 A | 11/2004 |

OTHER PUBLICATIONS

International Search Report of PCT/JP2010/065065, mailing date Sep. 28, 2010.

* cited by examiner

*Primary Examiner* — Jessica Stultz
*Assistant Examiner* — Delma Forde
(74) *Attorney, Agent, or Firm* — Westerman, Hattori, Daniels & Adrian, LLP

(57) ABSTRACT

A fiber laser device includes a pumping light source configured to output pumping light having a wavelength $\lambda$, and a rare earth-doped fiber, wherein when the intensity change rate of the pumping light with respect to the temperature is denoted by $\Delta P$ dB/° C., the wavelength change rate of the pumping light with respect to the temperature is denoted by $\Delta \lambda p$ nm/° C., the pumping light absorption change rate of the rare earth-doped fiber per unit wavelength change at the wavelength of $\lambda$ nm when the wavelength of the pumping light changes is denoted by $A'(\lambda)$ dB/nm, and the pumping light absorption change amount of the rare earth-doped fiber per unit temperature change at the wavelength of $\lambda$ nm when the temperature of the rare earth-doped fiber changes is denoted by $\Delta A(\lambda)$ dB/° C., the wavelength $\lambda$ of the pumping light is such a wavelength $\lambda$ that $\Delta P$, $\Delta \lambda p \times A'(\lambda)$ and $\Delta A(\lambda)$ compensate with each other.

3 Claims, 5 Drawing Sheets

■ FIRST EXAMPLE
◆ FIRST COMPARATIVE EXAMPLE

- ■ SECOND EXAMPLE
- ♦ SECOND COMPARATIVE EXAMPLE

FIBER LASER DEVICE

TECHNICAL FIELD

The invention relates to a fiber laser device.

BACKGROUND ART

Fiber laser devices are known as one type of laser devices used in processing machines, medical devices and measurement devices. Laser light output from the fiber laser devices can have higher focusing performance, higher power density and smaller spot size as compared to laser light output from other laser devices. Furthermore, the fiber laser devices can perform precision work, process in a noncontact manner, and process a hard substance that absorbs laser light. Accordingly, applications of the fiber laser devices have been rapidly expanding particularly in the field of processing machines.

The fiber laser devices typically employ the MO-PA method in which laser light that is seed light having relatively low power is output from a master oscillator MO, the laser light is then amplified by an optical fiber power amplifier PA to a desired intensity and output therefrom. In the optical fiber power amplifier, seed light and pumping light are input to a rare earth-doped fiber, a rare earth element of the rare earth-doped fiber is pumped by the pumping light, and the seed light is amplified by stimulated emission of the rare earth element.

However, the fiber laser devices are disadvantageous in that the gain of the optical fiber power amplifier varies and the intensity of output laser light varies since the wavelength of pumping light shifts due to a temperature change of the use environment or a temperature change of the fiber laser devices caused by operation thereof.

Accordingly, Patent Document 1 discloses a fiber laser device that can suppress such variation in the gain to a small amount even when the wavelength of pumping light shifts due to a temperature change of the use environment. The fiber laser device disclosed in Patent Document 1 includes an even number of pumping light sources, half of which are configured to oscillate at a wavelength longer than a pumping wavelength at the peak of the gain of a rare earth-doped fiber and the other half of which are configured to oscillate at a wavelength shorter than the pumping wavelength at the peak of the gain of the rare earth-doped fiber. With such a configuration, even when the wavelength of pumping light shifts due to a temperature change of the use environment, the pumping light output from one half of the pumping light sources shifts toward the gain peak of the rare earth-doped fiber while the pumping light output from the other half thereof shifts away from the gain peak of the rare earth-doped fiber. In this manner, the gain variation of the rare earth-doped fiber is compensated by the wavelength shifts of the respective pumping lights to allow stable light amplification (Patent Document 1).

CITATION LIST

Patent Document

[Patent Document 1] Japanese Patent Application Laid-Open No. 2000-228549

SUMMARY OF THE INVENTION

Problems to be Solved by the Invention

However, the fiber laser device disclosed in Patent Document 1 is disadvantageous in that the gain variation may not be sufficiently suppressed and processing and measurement may not be performed stably due to a temperature change of the use environment or a temperature change of the fiber laser device caused by operation thereof.

Therefore, an object of the invention is to provide a fiber laser device capable of performing processing and measurement stably even when the temperature of the use environment changes.

Means for Solving the Problems

The inventor has devoted himself to investigating the cause why the gain variation cannot be sufficiently suppressed in the fiber laser device disclosed in Patent Document 1. As a result, the inventor has reached a conclusion that not only the wavelength shift of the pumping light due to a temperature change of the use environment but also a change in the intensity of the pumping light due to the temperature change and a change in the absorption efficiency of the pumping light in the rare earth-doped fiber due to the temperature change need to be considered for the fiber laser device. Accordingly, the inventor has devoted himself to further researches so as to make the invention.

Specifically, a fiber laser device according to the invention includes: a pumping light source configured to output pumping light having a wavelength $\lambda$; and a rare earth-doped fiber to which the pumping light is input and which has a core doped with a rare earth element that absorbs the pumping light, wherein when an intensity change rate of the pumping light output from the pumping light source with respect to a temperature is denoted by $\Delta P$ dB/°C., a wavelength change rate of the pumping light output from the pumping light source with respect to the temperature is denoted by $\Delta \lambda p$ nm/°C., a pumping light absorption change rate of the pumping light in the rare earth-doped fiber per unit wavelength change at the wavelength of $\lambda$ nm when the wavelength of the pumping light changes is denoted by $A'(\lambda)$ dB/nm, and a pumping light absorption change amount of the rare earth-doped fiber per unit temperature change at the wavelength of $\lambda$ nm when the temperature of the rare earth-doped fiber changes is denoted by $\Delta A(\lambda)$ dB/°C., the wavelength $\lambda$ of the pumping light is such a wavelength $\lambda$ that $\Delta P$, $\Delta \lambda p \times A'(\lambda)$ and $\Delta A(\lambda)$ compensate with each other.

In such a fiber laser device, even when the intensity and the wavelength of the pumping light output from the pumping light source change due to a temperature change of the use environment of the fiber laser device or a temperature change of the fiber laser device caused by operation thereof, the absorption of the pumping light in the rare earth-doped fiber changes according to the temperature change and the wavelength change. Here, the intensity change rate of the pumping light output from the pumping light source with respect to the temperature is denoted by $\Delta P$ dB/°C., the wavelength change rate of the pumping light output from the pumping light source with respect to the temperature is denoted by $\Delta \lambda p$ nm/°C., the pumping light absorption change rate of the rare earth-doped fiber per unit wavelength change at the wavelength of $\lambda$ nm when the wavelength of the pumping light changes is denoted by $A'(\lambda)$ dB/nm, and the pumping light absorption change amount of the rare earth-doped fiber per unit temperature change at the wavelength of $\lambda$ nm when the temperature of the rare earth-doped fiber changes is denoted by $\Delta A(\lambda)$ dB/°C. Then, the wavelength $\lambda$ of the pumping light is set to such a wavelength $\lambda$ that $\Delta P$, $\Delta \lambda p \times A'(\lambda)$ and $\Delta A(\lambda)$ compensate with each other. Therefore, the variation in the absorption of the pumping light in the rare earth-doped fiber can be suppressed. Since the variation in the absorption of the pumping light in the rare earth-doped fiber is suppressed in this manner even when the temperature of the use environment of the fiber laser device changes and/or the temperature of the fiber laser device changes due to operation thereof, it is possible to stabilize the gain of the fiber laser device and to perform processing and measurement stably.

Alternatively, a fiber laser device according to the invention includes: a pumping light source configured to output pumping light having a wavelength λ; and a rare earth-doped fiber to which the pumping light is input and which has a core doped with a rare earth element that absorbs the pumping light, wherein when an intensity change rate of the pumping light output from the pumping light source with respect to a temperature is denoted by ΔP dB/° C., a wavelength change rate of the pumping light output from the pumping light source with respect to the temperature is denoted by Δλp nm/° C., a pumping light absorption change rate of the pumping light in the rare earth-doped fiber per unit wavelength change at the wavelength of λ nm when the wavelength of the pumping light changes is denoted by A' (λ) dB/nm, and a pumping light absorption change amount of the rare earth-doped fiber per unit temperature change at the wavelength of λ nm when the temperature of the rare earth-doped fiber changes is denoted by ΔA (λ) dB/° C., the wavelength λ of the pumping light satisfies:

$$\Delta P+\Delta\lambda p\times A'(\lambda)+\Delta A(\lambda)=0.$$

With such a configuration, it is possible to further stabilize the intensity of laser light output from the fiber laser device and to perform processing and measurement more stably.

In the fiber laser device, it is preferable that the rare earth element be ytterbium and that the core be further doped with phosphorus.

Effect of the Invention

According to the invention, a fiber laser device capable of performing processing and measurement stably even when the temperature of the use environment changes is provided.

BEST MODE FOR CARRYING OUT THE INVENTION

Figure 1:
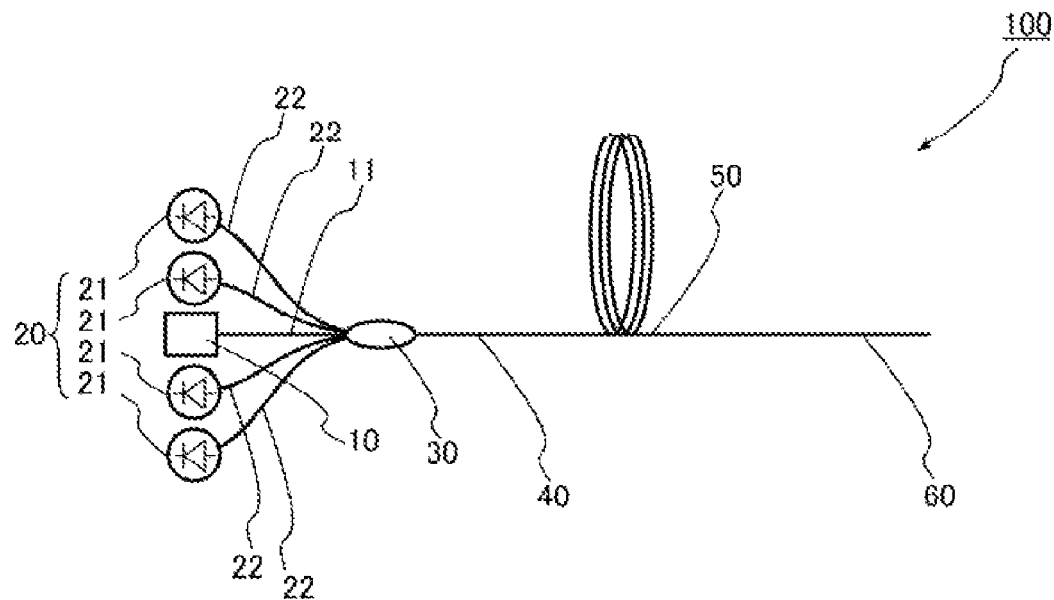
FIG. 1 is a diagram showing a fiber laser device according to an embodiment of the invention.

A preferred embodiment of a fiber laser device according to the invention will be described in detail below referring to the drawings.

FIG. 1 is a diagram showing a fiber laser device according to an embodiment of the invention.

As shown in FIG. 1, a fiber laser device 100 according to this embodiment includes, as main components: a seed light source 10 configured to output laser light as seed light; a pumping light source 20 configured to output pumping light; an input double-clad fiber 40 into which the seed light and the pumping light are input; an optical coupler 30 configured to input the pumping light and the seed light to the input double-clad fiber 40; a rare earth-doped fiber 50 connected to the input double-clad fiber 40; and an output double-clad fiber 60 connected to the rare earth-doped fiber 50.

The seed light source 10 may be constituted by a laser light source including a laser diode or by a fiber laser device of fabry-perot type or fibering type, for example. The seed light output from the seed light source may be laser light having a wavelength of 1070 nm, for example, but is not particularly limited thereto. The seed light source 10 is coupled to a single mode fiber 11 having a core and a clad coating the core. The seed light output from the seed light source 10 propagates through the core of the single mode fiber 11 as single mode light. Preferably, the seed light source 10 outputs seed light having a constant intensity and a constant wavelength even when the temperature of the environment changes.

The pumping light source 20 is constituted by a plurality of laser diodes 21. The laser diodes 21 are fabry-perot type semiconductor lasers made of GaAs-based semiconductor materials and output pumping light having a wavelength of 910 nm. The laser diodes 21 of the pumping light source 20 are respectively connected to multi mode fibers 22. The pumping light output from each laser diode 21 propagates through the multi mode fiber 22 as multi mode light.

The optical coupler 30 to which the multi mode fibers 22 are connected is formed by fusing and elongating the single mode fiber 11 and the multi mode fibers 22 together, and connected to the input double-clad fiber 40.

Figure 2:
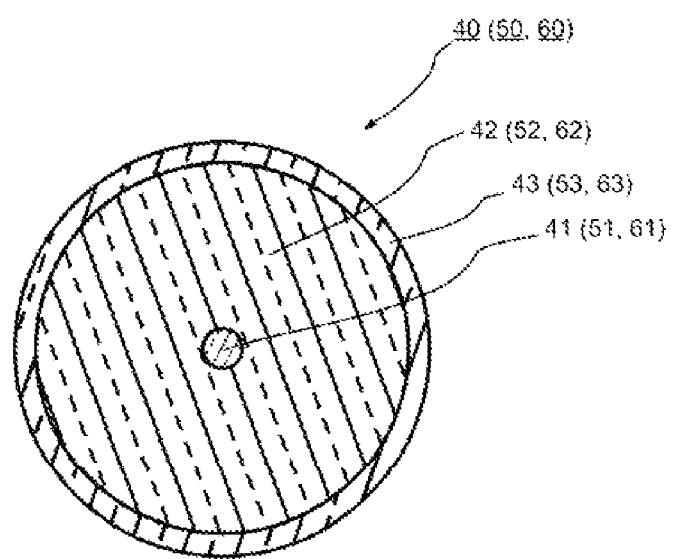
FIG. 2 is a sectional view showing a cross-sectional structure of an input double-clad fiber (a rare earth-doped fiber; an output double-clad fiber) shown in FIG. 1.

FIG. 2 is a sectional view showing a cross-sectional structure of the input double-clad fiber 40 connected to the optical coupler 30. As shown in FIG. 2, the input double-clad fiber 40 has a core 41, a clad 42 coating the core 41, and a plastic clad 43 coating the clad 42. The clad 42 has a lower refractive index than the core 41, and the plastic clad 43 has a significantly lower refractive index than the clad 42. Silica doped with an element such as aluminum that increases the refractive index of silica, for example, may be used as a material for the core 41, silica without any dopant, for example, may be used as a material for the clad 42, and UV curable resin, for example, may be used as a material for the plastic clad 43.

The rare earth-doped fiber 50 connected to the input double-clad fiber 40 has a cross-sectional structure similar to that of the input double-clad fiber 40 shown in FIG. 2, and has a core 51, a clad 52 coating the core 51, and a plastic clad 53 coating the clad 52. The clad 52 has a lower refractive index than the core 51, and the plastic clad 53 has a significantly lower refractive index than the clad 52. The diameter of the core 51, the outer diameter of the clad 52 and the outer diameter of the plastic clad 53 are equal to the diameter of the core 41, the outer diameter of the clad 42 and the outer diameter of the plastic clad 43 of the input double-clad fiber 40, respectively. Silica doped with a rare earth element such as ytterbium (Yb) that is pumped by pumping light output from the pumping light source 20 and an element such as aluminum that increases the refractive index of silica, for example, may be used as a material for the core 51, silica without any dopant, for example, may be used as a material for the clad 52, and UV curable resin, for example, may be used as a material for the plastic clad 53.

The output double-clad fiber 60 connected to the rare earth-doped fiber 50 has a cross-sectional structure similar to that of the input double-clad fiber 40 shown in FIG. 2, and has a core 61, a clad 62 coating the core 61, and a plastic clad 63 coating the clad 62. The diameter of the core 61, the outer diameter of the clad 62, the outer diameter of the plastic clad 63 and the materials for the core 61, the clad 62 and the plastic clad 63 are equal to the diameter of the core 41, the outer diameter of the clad 42, the outer diameter of the plastic clad 43 of the input double-clad fiber 40 and the materials therefor, respectively. An end of the output double-clad fiber 60 on a side opposite to the rare earth-doped fiber 50 is an output end to which nothing is connected.

In such a fiber laser device 100, the output intensity of the pumping light output from the pumping light source 20 changes by a certain amount per unit temperature change as the temperature of the fiber laser device changes. In addition, the wavelength of the pumping light changes by a certain amount per unit temperature change as the temperature of the fiber laser device changes. The amounts of change are predetermined by the structure and the material of the pumping light source 20.

In the rare earth-doped fiber 50, the absorption of the pumping light changes as the wavelength of the input pumping light changes. Further, in the rare earth-doped fiber 50, the absorption of the input pumping light changes as the temperature changes. The amounts of change are predetermined by the structure and the material of the rare earth-doped fiber 50. The absorption is an amount proportional to a ratio of the intensity of absorbed light (wavelength: λ) to the intensity of incident light (wavelength: λ).

Here, the intensity change rate of the pumping light output from the pumping light source 20 with respect to the temperature is denoted by $\Delta P$ dB/° C., the wavelength change rate of the pumping light output from the pumping light source 20 with respect to the temperature is denoted by $\Delta \lambda p$ nm/° C., the pumping light absorption change rate of the rare earth-doped fiber 50 per unit wavelength change at the wavelength of λ nm when the wavelength of the pumping light changes is denoted by $A'(\lambda)$ dB/nm, and the pumping light absorption change amount of the rare earth-doped fiber 50 per unit temperature change at the wavelength of λ nm when the temperature of the rare earth-doped fiber 50 changes is denoted by $\Delta A(\lambda)$ dB/° C. Then, the wavelength λ of the pumping light in the fiber laser device 100 according to this embodiment is set to such a wavelength λ that $\Delta P$, $\Delta \lambda p \times A'(\lambda)$ and $\Delta A(\lambda)$ compensate with each other. Preferably, the wavelength λ of the pumping light is set to such a wavelength λ that the absolute value of $\Delta P + \Delta \lambda p \times A'(\lambda) + \Delta A(\lambda)$ is minimum. More preferably, the wavelength λ of the pumping light is set to such a wavelength λ that satisfies:

$$\Delta P + \Delta \lambda p \times A'(\lambda) + \Delta A(\lambda) = 0.$$

This setting is made under real use conditions (such as temperature range and the output state of the pumping light in real use) of the fiber laser device 100, and is preferably made at a center value of the use temperature range. The setting of the wavelength λ of the pumping light includes selection by the oscillation wavelength λ under real use conditions of a semiconductor laser used as the pumping light source 20. The oscillation wavelength of the pumping light source 20 refers to a center wavelength of an oscillation intensity spectrum.

The fiber laser device 100 configured as described above operates as follows.

First, seed light is output from the seed light source 10 and pumping light is output from the pumping light source 20. The seed light output from the seed light source 10 has a wavelength of 1070 nm, for example. The seed light output from the seed light source 10 propagates through the core of the single mode fiber 11 as single mode light and enters the optical coupler.

The pumping light output from the pumping light source 20, on the other hand, has a wavelength of 910 nm, for example. The pumping light output from the pumping light source 20 propagates through the multi mode fibers 22 as multi mode light and enters the optical coupler 30.

The seed light input to the optical coupler 30 in this manner propagates through the core 41 of the input double-clad fiber 40 as single mode light, enters the core 51 of the rare earth-doped fiber 50 and propagates therethrough as single mode light. The pumping light input to the optical coupler 30, on the other hand, propagates inside of the outer circumference of the clad 42 of the input double-clad fiber 40 as multi mode light, enters the rare earth-doped fiber 50, and propagates inside of the outer circumference of the clad 52 of the rare earth-doped fiber 50 as multi mode light.

The pumping light is absorbed by the rare earth element doped in the core 51 and pumps the rare earth element while passing through the core 51 of the rare earth-doped fiber 50. The pumped rare earth element causes stimulated emission by the seed light, and the seed light is amplified by the stimulated emission and output from the rare earth-doped fiber 50 as laser light. The laser light output from the rare earth-doped fiber 50 is output through the output end of the output double-clad fiber 60.

If the temperature of the fiber laser device 100 changes when laser light is output from the fiber laser device 100 in this manner, the temperature of the pumping light source 20 also changes, which changes the intensity and the wavelength of the pumping light output from the pumping light source 20. Further, the absorption of the pumping light in the rare earth-doped fiber 50 changes with the change of the wavelength of the pumping light. Further, as the temperature of the fiber laser device 100 changes, the temperature of the rare earth-doped fiber 50 also changes, and the absorption of the input pumping light in the rare earth-doped fiber 50 changes even if the wavelength of the pumping light does not change.

Here, the intensity change rate of the pumping light output from the pumping light source 20 with respect to the temperature is denoted by $\Delta P$ dB/° C., the wavelength change rate of the pumping light output from the pumping light source 20 with respect to the temperature is denoted by $\Delta \lambda p$ nm/° C., the pumping light absorption change rate of the rare earth-doped fiber 50 per unit wavelength change at the wavelength of λ nm when the wavelength of the pumping light changes is denoted by A' (λ) dB/nm, and the pumping light absorption change amount of the rare earth-doped fiber 50 per unit temperature change at the wavelength of λ nm when the temperature of the rare earth-doped fiber 50 changes is denoted by ΔA (λ) dB/° C. as described above. Then, the wavelength λ of the pumping light in the fiber laser device 100 according to this embodiment is set to such a wavelength λ that ΔP, Δλp×A' (λ) and ΔA (λ) compensate with each other. Therefore, the variation in the absorption of the pumping light in the rare earth-doped fiber 50 is suppressed even when the temperature of the fiber laser device 100 changes.

According to the fiber laser device 100 according to this embodiment, when the intensity and the wavelength of pumping light output from the pumping light source 20 change due to a temperature change of the use environment of the fiber laser device 100 or a temperature change of the fiber laser device 100 caused by operation thereof, the absorption of the pumping light in the rare earth-doped fiber 50 changes according to the temperature change and the wavelength change of the pumping light. Here, the intensity change rate of the pumping light output from the pumping light source 20 with respect to the temperature is denoted by ΔP dB/° C., the wavelength change rate of the pumping light output from the pumping light source 20 with respect to the temperature is denoted by Δλp nm/° C., the pumping light absorption change rate of the rare earth-doped fiber 50 per unit wavelength change at the wavelength of λ nm when the wavelength of the pumping light changes is denoted by A' (λ) dB/nm, and the pumping light absorption change amount of the rare earth-doped fiber 50 per unit temperature change at the wavelength of λ nm when the temperature of the rare earth-doped fiber 50 changes is denoted by ΔA (λ) dB/° C. Then, the wavelength λ of the pumping light is set to such a wavelength λ that ΔP, Δλp×A' (λ) and ΔA (λ) compensate with each other. Therefore, the variation in the absorption of the pumping light in the rare earth-doped fiber 50 can be suppressed even when the temperature changes. Since the variation in the absorption of the pumping light in the rare earth-doped fiber 50 is suppressed in this manner even when the temperature of the use environment of the fiber laser device 100 changes and/or the temperature of the fiber laser device 100 changes due to operation thereof, it is possible to stabilize the gain of the fiber laser device 100 and to perform processing and measurement stably.

Although the invention has been described above by reference to a certain embodiment as an example, the invention is not limited thereto.

For example, the output double-clad fiber 60 may be a single mode fiber in the embodiment described above. Multi mode fibers allowing seed light from the seed light source 10 to propagate therethrough to the optical coupler 30 may also be used in place of the single mode fiber 11.

The input double-clad fiber 40 and the output double-clad fiber 60 may be omitted in the embodiment described above.

The intensity change rate ΔP of the pumping light from the pumping light source with respect to the temperature and the wavelength change rate Δλp of the pumping light output from the pumping light source with respect to the temperature are constant independent of the temperature and the wavelength in the embodiment described above. However, the advantageous effects of the invention can also be produced even when the rates of change are dependent on the temperature and the wavelength by setting the wavelength λ at which real use conditions are met using the values thereof under the real use conditions.

EXAMPLES

The invention will be more specifically explained below with examples and comparative examples, but the invention is not limited thereto.

First Example

A fiber laser device similar to that of the embodiment shown in FIG. 1 was prepared.

The seed light source was configured to output pulsed laser light having a wavelength of 976 nm, a pulse width of 100 ns and a peak power of about 5 W. The seed light source was arranged at a position away from the pumping light source and the rare earth-doped fiber shown in FIG. 1 so that the temperature would not change and that the variation in the output would not be produced.

Fabry-perot type laser diodes using GaAs-based materials were used as the pumping light source of the fiber laser device, and the pumping light source was configured to output pumping light having a wavelength of 910 nm and an intensity of 30 W. Each of the multi mode fibers connected to the respective laser diodes of the pumping light source had a core diameter of 105 μm and a clad outer diameter of 125 μm.

The optical coupler was configured to optically couple the single mode fiber connected to the seed light source and the multi mode fibers to which the pumping light source was connected with the input double-clad fiber so that the seed light output from the seed light source and the pumping light output from the pumping light source were input to the input double-clad fiber. A fiber having a core diameter of 6 μm, a clad outer diameter of 125 μm and a plastic clad outer diameter of 250 μm was used as the input double-clad fiber.

The rare earth-doped fiber was connected to the input double-clad fiber. The core diameter, the clad outer diameter and the plastic clad outer diameter of the rare earth-doped fiber were equal to those of the input optical fiber, respectively. Silica doped with ytterbium (Yb) ions was used for the core, and silica without any dopant was used for the clad. The rare earth-doped fiber was configured to absorb the pumping light of 976 nm at 1200 dB per 1 m and to have a length of 10 m.

The output double-clad fiber was connected to the rare earth-doped fiber. The output double-clad fiber was structured similarly to the input double-clad fiber.

The intensity change rate ΔP of the pumping light output from the pumping light source with respect to the temperature and the wavelength change rate Δλp of the pumping light output from the pumping light source with respect to the temperature of the fiber laser device prepared as described above were measured. As a result, the following values were obtained:

$$\Delta P = -0.0085 \, [\text{dB}/^\circ \text{C.}]$$

and $$\Delta \lambda p = 0.35 \, [\text{nm}/^\circ \text{C.}].$$

Figure 3:
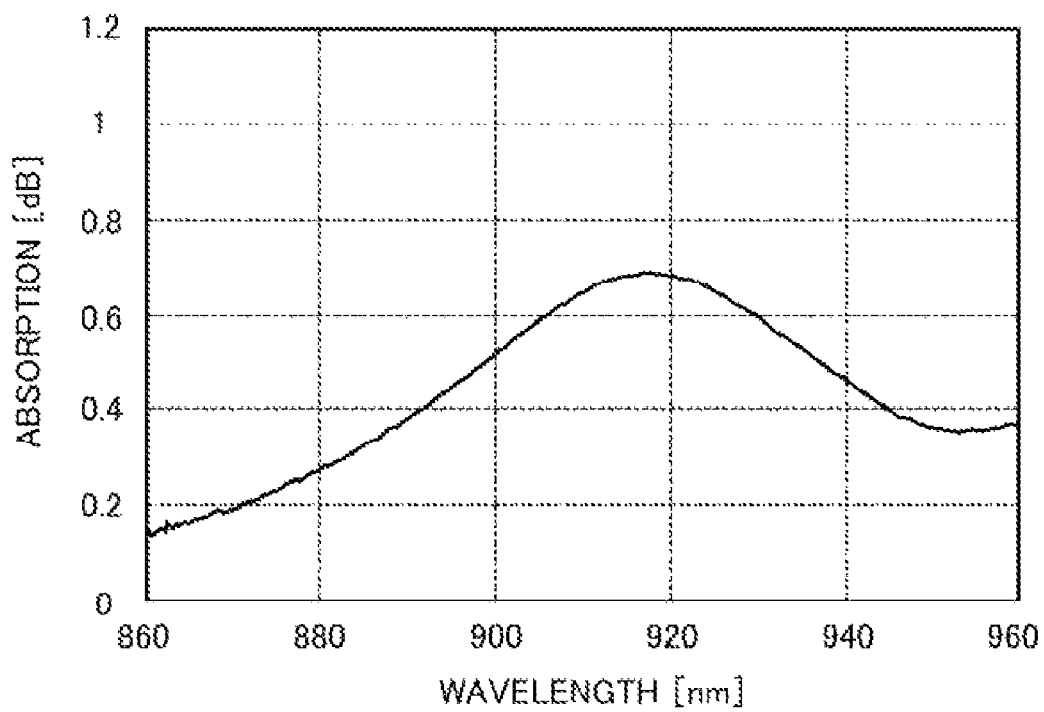
FIG. 3 is a graph plotting measurement results for a rare earth-doped fiber of a first example, in which the horizontal axis represents the wavelength of incident light and the vertical axis represents the absorption of the incident light.

The absorption spectrum of the light (pumping light) incident to the rare earth-doped fiber was also measured. The results are shown in FIG. 3. FIG. 3 is a graph plotting the measurement results, in which the horizontal axis represents the wavelength of the incident light and the vertical axis represents the absorption of the incident light. FIG. 3 shows that the absorption of the pumping light absorbed by the rare earth-doped fiber changes as the wavelength of the pumping light changes.

Figure 4:
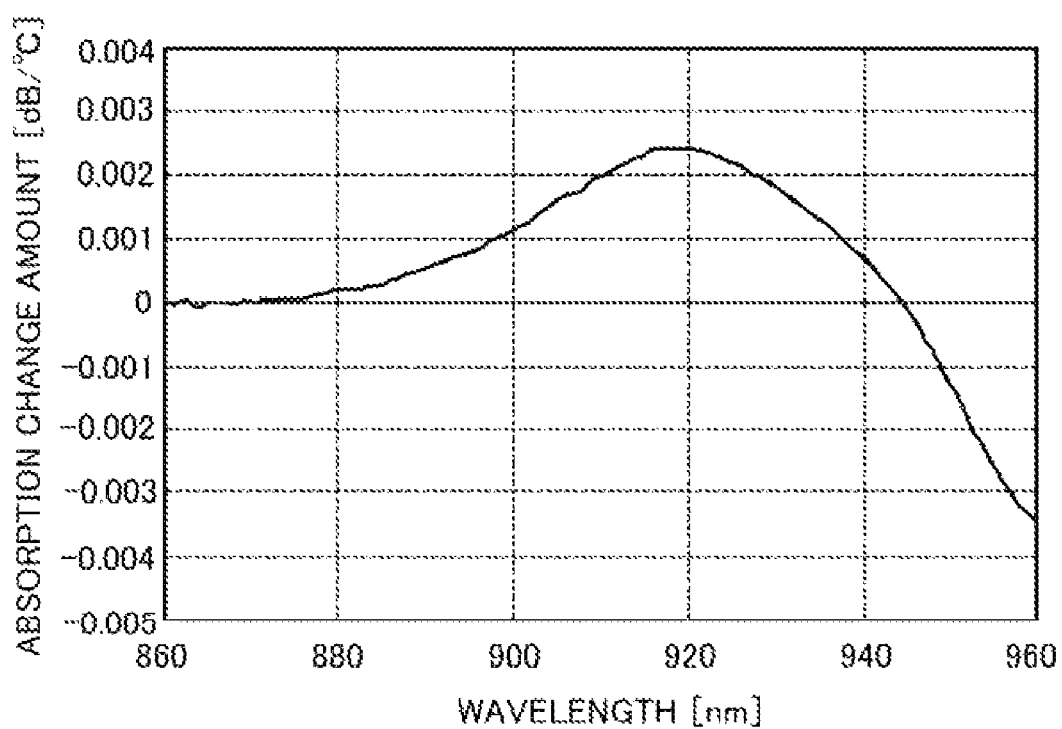
FIG. 4 is a graph plotting measurement results for the rare earth-doped fiber of the first example, in which the horizontal axis represents the wavelength of incident light and the vertical axis represents the amount of change of incident light absorption.

In addition, the change in the absorption of the pumping light in the rare earth-doped fiber per unit temperature change with respect to the wavelength λ of the pumping light was measured. The results are shown in FIG. 4. FIG. 4 is a graph plotting the measurement results, in which the horizontal axis represents the wavelength of the incident light and the vertical axis represents the amount of change of the incident light absorption. FIG. 4 shows that the absorption of the pumping light absorbed by the rare earth-doped fiber changes as the temperature of the rare earth-doped fiber changes, and that the absorption is dependent on the wavelength of the pumping light.

Figure 5:
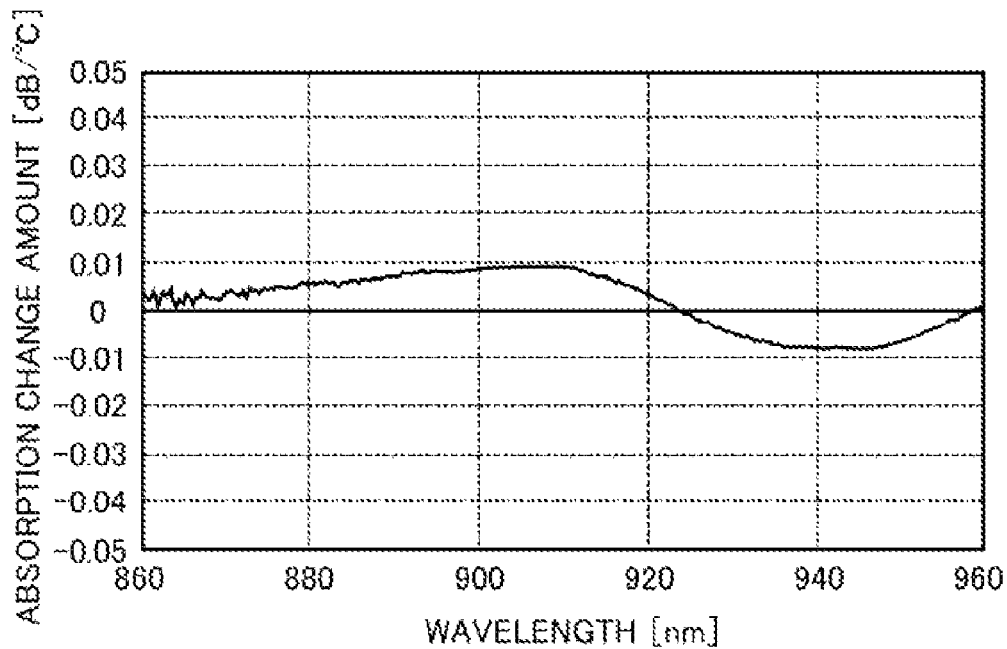
FIG. 5 is a graph plotting results of calculation based on the data shown in FIGS. 3 and 4 for the rare earth-doped fiber of the first example, in which the horizontal axis represents the wavelength of pumping light and the vertical axis represents the amount of change of pumping light absorption.

The absorption of the pumping light in the rare earth-doped fiber in a case where the wavelength of the pumping light changed by 0.035 nm per unit temperature change and the absorption in the rare earth-doped fiber changed as shown in FIG. 4 was calculated based on the thus measured data shown in FIGS. 3 and 4. The results are shown in FIG. 5. FIG. 5 is a graph plotting the calculation results, in which the horizontal axis represents the wavelength of the pumping light and the vertical axis represents the amount of change of the pumping light absorption. FIG. 5 shows that the amount of change of the absorption of the pumping light absorbed by the rare earth-doped fiber per unit temperature change from a wavelength of about 907 nm to 912 nm was 0.0085 dB/° C. Since the intensity change amount ΔP of the light output from the pumping light source is −0.0085 dB/° C. as described above, the absorption of the pumping light in the rare earth-doped fiber can be kept constant at least near an initial temperature even if the temperature changes from the initial state by setting the wavelength of the light output from the pumping light source within a range of 907 nm to 912 nm. The set wavelength of the pumping light is shorter than about 918 nm at which the slope of the absorption spectrum of the rare earth-doped fiber shown in FIG. 3 is 0, and shorter than about 918 nm at which the slope of the wavelength dependent characteristic of pumping light absorption change amount of the rare earth-doped fiber per unit temperature change shown in FIG. 4 is 0.

In the prepared fiber laser device, pumping light having a wavelength of 910 nm, which is within the range of about 907 nm to 912 nm, is output from the pumping light source. Here, the intensity change rate of the pumping light output from the pumping light source with respect to the temperature is denoted by ΔP dB/° C., the wavelength change rate of the pumping light output from the pumping light source with respect to the temperature is denoted by Δλp nm/° C., the pumping light absorption change rate of the rare earth-doped fiber per unit wavelength change at the wavelength of λ nm when the wavelength of the pumping light changes is denoted by A' (λ) dB/nm, and the pumping light absorption change amount of the rare earth-doped fiber per unit temperature change at the wavelength of λ nm when the temperature of the rare earth-doped fiber changes is denoted by ΔA (λ) dB/° C. Then, the wavelength λ of the pumping light in the fiber laser device according to the first example is set to such a wavelength λ that ΔP, Δλp×A' (λ) and ΔA (λ) compensate with each other and that satisfies:

$$\Delta P + \Delta\lambda p \times A'(\lambda) + \Delta A(\lambda) = 0.$$

Figure 6:
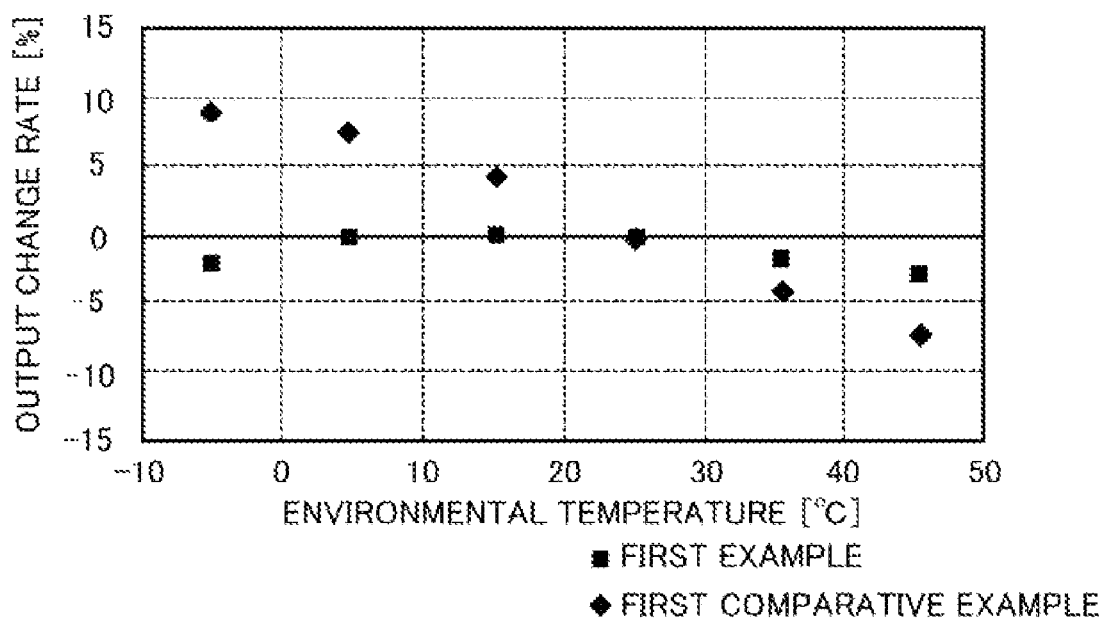
FIG. 6 is a graph showing how the rates of change of laser light output from the fiber laser devices of the first example and a first comparative example vary.

Next, the prepared fiber laser device was made to output laser light and the environmental temperature of the fiber laser device was changed. The intensity change rate of the output light was measured using the intensity at an air temperature of 25° C. as a reference value. The results are shown in FIG. 6. As shown in FIG. 6, the results show that the variation in the output from the fiber laser device of the first example was suppressed even when the environmental temperature changed.

Second Example

A fiber laser device similar to that of the embodiment shown in FIG. 1 was also prepared in this example. The seed light source was similar to that of the first example. The pumping light source was similar to that of the first example except that the wavelength of the pumping light was 940 nm. The optical coupler, the input double-clad fiber and the output double-clad fiber were similar to those of the first example.

In addition, a rare earth-doped fiber made of silica having a core doped with ytterbium (Yb) ions and phosphorus (P) ions, absorbing the pumping light of 976 nm at 1200 dB per 1 m and having a length of 10 m was used for the rare earth-doped fiber in this example.

In this example, the intensity change rate ΔP of the pumping light output from the pumping light source with respect to the temperature and the wavelength change rate Δμp of the pumping light output from the pumping light source with respect to the temperature were as follows, which are equal to those of the first example:

$$\Delta P = -0.0085 \ [\text{dB}/° \text{C.}]$$

and $$\Delta\lambda p = 0.35 \ [\text{nm}/° \text{C.}].$$

Figure 7:
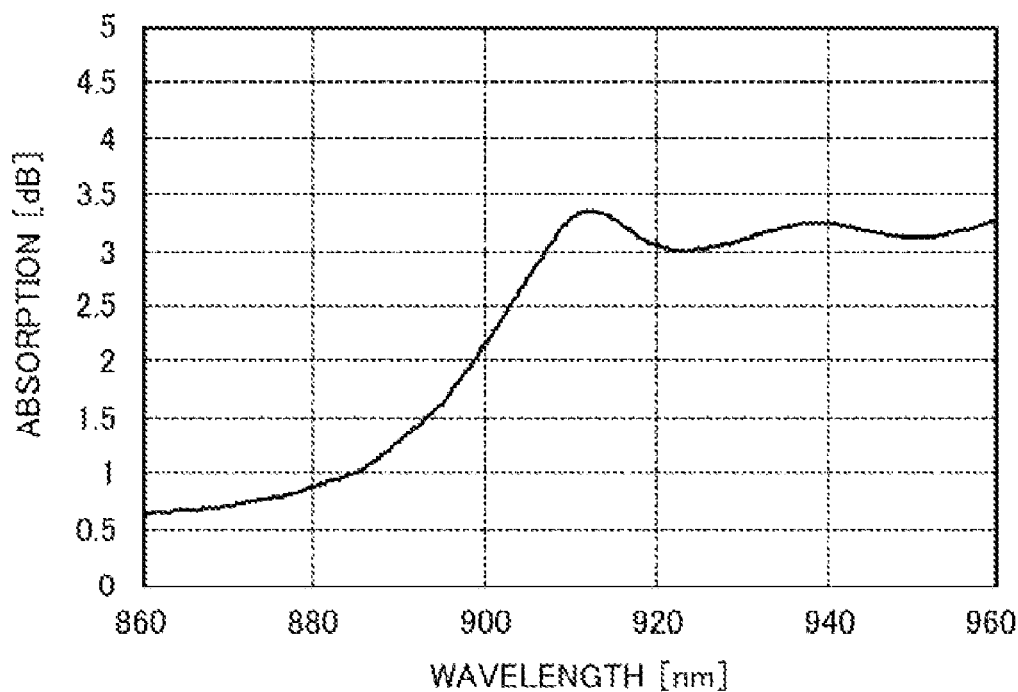
FIG. 7 is a graph plotting measurement results for a rare earth-doped fiber of a second example, in which the horizontal axis represents the wavelength of incident light and the vertical axis represents the absorption of the incident light.

The absorption spectrum of the light (pumping light) incident to the rare earth-doped fiber was also measured. The results are shown in FIG. 7. FIG. 7 is a graph plotting the measurement results in which the horizontal axis represents the wavelength of the incident light and the vertical axis represents the absorption of the incident light. FIG. 7 shows that the absorption of the pumping light absorbed by the rare earth-doped fiber changes as the wavelength of the pumping light changes.

Figure 8:
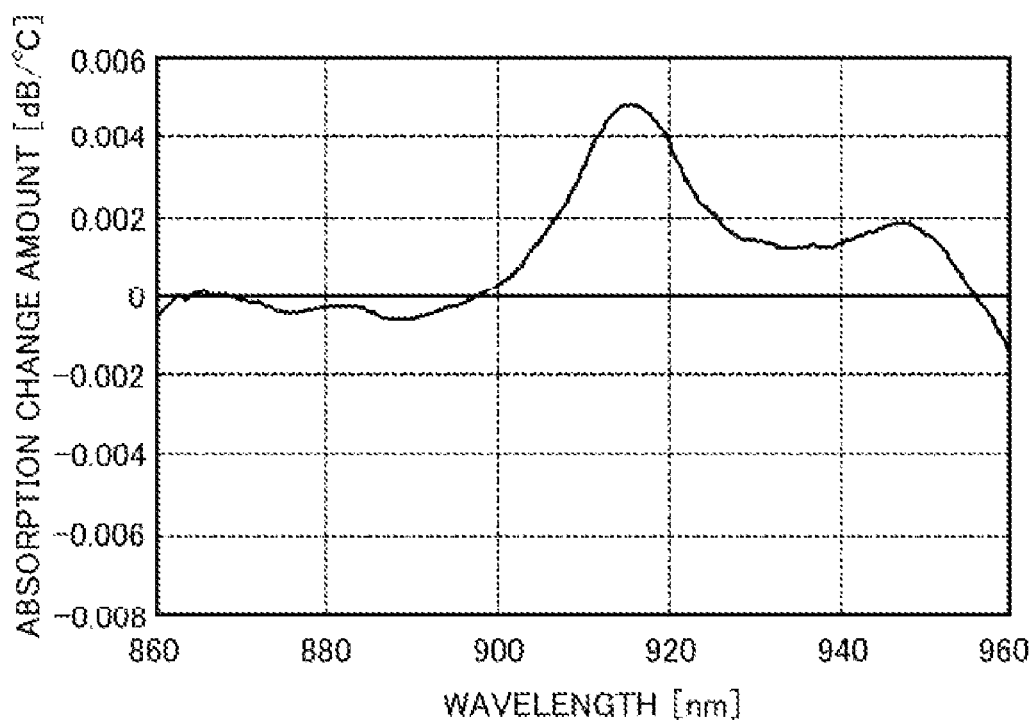
FIG. 8 is a graph plotting measurement results for the rare earth-doped fiber of the second example, in which the horizontal axis represents the wavelength of incident light and the vertical axis represents the amount of change of incident light absorption.

In addition, the change in the absorption of the pumping light in the rare earth-doped fiber per unit temperature change with respect to the wavelength λ of the pumping light was measured. The results are shown in FIG. 8. FIG. 8 is a graph plotting the measurement results, in which the horizontal axis represents the wavelength of the incident light and the vertical axis represents the amount of change of the incident light absorption. FIG. 8 shows that the absorption of the pumping light absorbed by the rare earth-doped fiber changes as the temperature of the rare earth-doped fiber changes, and that the absorption is dependent on the wavelength of the pumping light.

Figure 9:
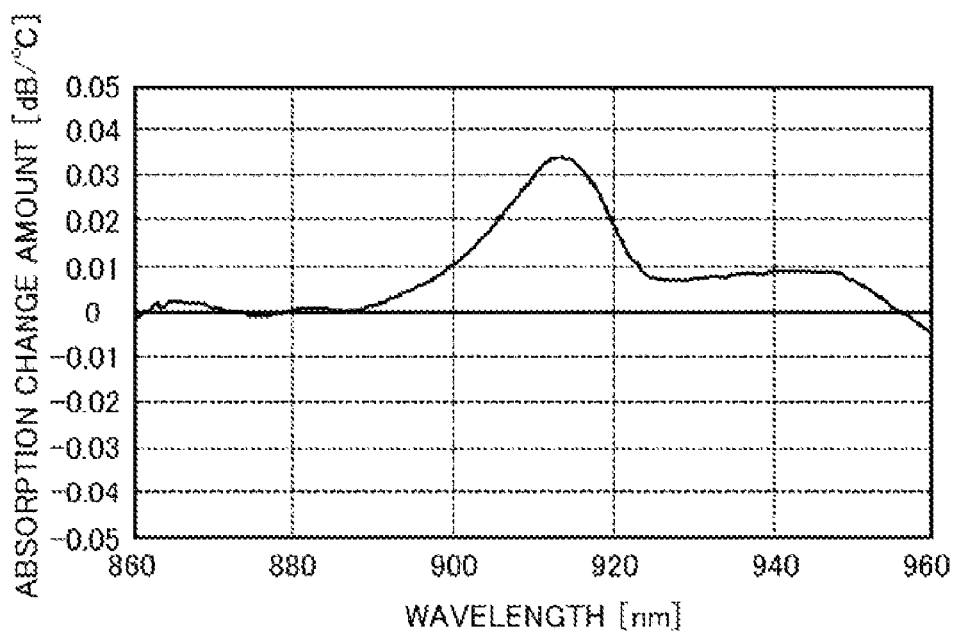
FIG. 9 is a graph plotting results of calculation based on the data shown in FIGS. 7 and 8 for the rare earth-doped fiber of the second example, in which the horizontal axis represents the wavelength of pumping light and the vertical axis represents the amount of change of pumping light absorption.

The absorption of the pumping light in the rare earth-doped fiber in a case where the wavelength of the pumping light changed by 0.035 nm per unit temperature change and the absorption in the rare earth-doped fiber changed as shown in FIG. 8 was calculated based on the thus measured data shown in FIGS. 7 and 8. The results are shown in FIG. 9. FIG. 9 is a graph plotting the calculation results, in which the horizontal axis represents the wavelength of the pumping light and the vertical axis represents the amount of change of the pumping light absorption. FIG. 9 shows that the amount of change of the absorption of the pumping light absorbed by the rare earth-doped fiber per unit temperature change from a wavelength of about 925 nm to 950 nm was 0.0085 dB/° C. Since the intensity change amount ΔP per unit temperature change of the light output from the pumping light source is −0.0085 dB/° C. as described above, the absorption of the pumping light in the rare earth-doped fiber can be kept constant at least near an initial temperature even if the temperature changes from the initial state by setting the wavelength of the light output from the pumping light source within a range of 925 nm to 950 nm. According to this example, as a result of doping P in the core of the rare earth-doped fiber, the wavelength range in which the amount of change of the absorption of the pumping light was about 0.0085 dB/° C. was about 25 nm from about 925 nm to 950 nm, which is wider than that of the first example, in the graph of absorption of the pumping light in the rare earth-doped fiber in the case where the wavelength of the pumping light changed by 0.035 nm per unit temperature change and the absorption in the rare earth-doped fiber changed as shown in FIG. 9.

In the prepared fiber laser device, pumping light having a wavelength of 940 nm, which is within the range of about 925 nm to 950 nm, is output from the pumping light source. Here, the intensity change rate of the pumping light output from the pumping light source with respect to the temperature is denoted by ΔP dB/° C., the wavelength change rate of the pumping light output from the pumping light source with respect to the temperature is denoted by Δλp nm/° C., the pumping light absorption change rate of the rare earth-doped fiber per unit wavelength change at the wavelength of λ nm when the wavelength of the pumping light changes is denoted by A' (λ) dB/nm, and the pumping light absorption change amount of the rare earth-doped fiber per unit temperature change at the wavelength of λ nm when the temperature of the rare earth-doped fiber changes is denoted by ΔA (λ) dB/° C. Then, the wavelength λ of the pumping light in the fiber laser device according to this example is set to such a wavelength λ that ΔP, Δλp×A' (λ) and ΔA (λ) compensate with each other and that satisfies:

$$\Delta P + \Delta\lambda p \times A'(\lambda) + \Delta A(\lambda) = 0.$$

Since the above equation is satisfied in the wide wavelength band of about 925 nm to 950 nm, the absorption of the pumping light in the rare earth-doped fiber can be kept constant even for a larger temperature change. The set wavelength of the pumping light is longer than about 915 nm at which the absorption spectrum of the rare earth-doped fiber shown in FIG. 7 reaches a maximum value at the slope of 0, and longer than about 913 nm at which the wavelength dependent characteristic of pumping light absorption change amount of the rare earth-doped fiber per unit temperature change shown in FIG. 9 reaches a maximum value 0 at the slope of 0.

Figure 10:
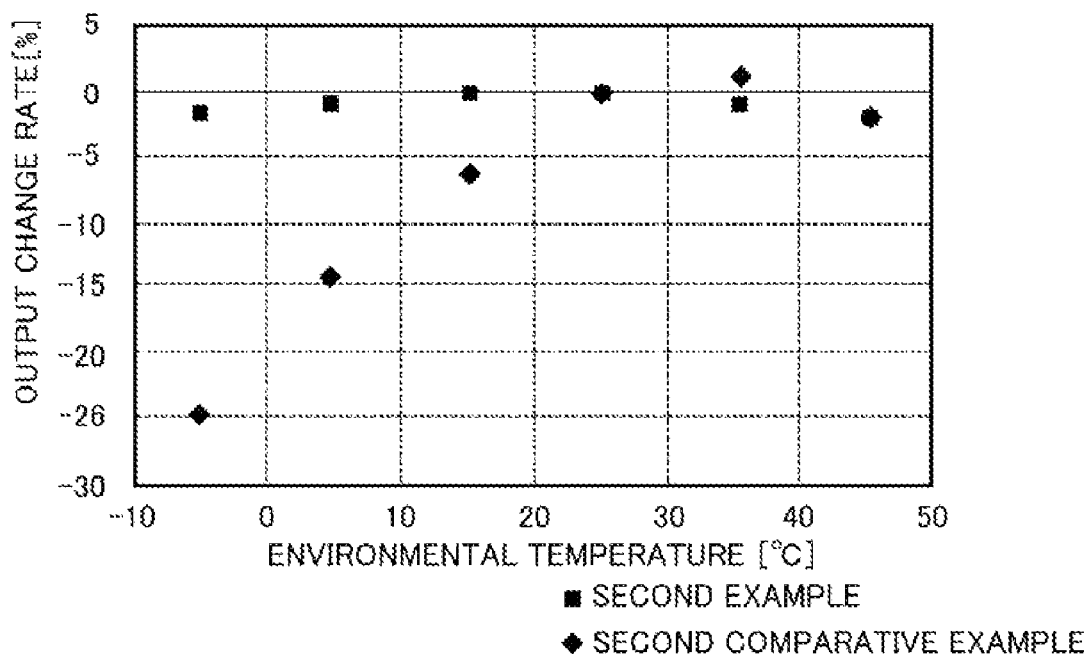
FIG. 10 is a graph showing how the rates of change of laser light output from the fiber laser devices of the second example and a second comparative example vary.

The prepared fiber laser device was made to output laser light and the environmental temperature of the fiber laser device was changed. The intensity change rate of the output light was measured using the intensity at an air temperature of 25° C. as a reference value. The results are shown in FIG. 10. As shown in FIG. 10, the results show that the variation in the output from the fiber laser device of the second example was suppressed even when the environmental temperature changed.

First Comparative Example

A fiber laser device was prepared similarly to that of the first example except that the wavelength of the pumping light output from the pumping light source shown in FIG. 1 was 920 nm.

The intensity change rate ΔP of the pumping light output from the pumping light source with respect to the temperature and the wavelength change rate 44 of the pumping light output from the pumping light source with respect to the temperature were measured. As a result, the following values were obtained:

$$\Delta P = -0.0085 \ [dB/° C.]$$

and $$\Delta\mu p = 0.35 \ [nm/° C.],$$

which were equal to those of the first example.

Since the rare earth-doped fiber of the first comparative example was the same as that of the first example, the absorption spectrum of the light (pumping light) incident to the rare earth-doped fiber was as shown in FIG. 3. In addition, the change in the absorption of the pumping light in the rare earth-doped fiber per unit temperature change with respect to the wavelength λ of the pumping light was as shown in FIG. 4. Further, the results of calculating the absorption of the pumping light in the rare earth-doped fiber in a case where the wavelength of the pumping light changed by 0.035 nm per unit temperature change and the absorption in the rare earth-doped fiber varied as shown in FIG. 4 were as shown in FIG. 5.

In the fiber laser device of the first comparative example, the pumping light having a wavelength of 920 nm, which does not fall within the range of about 907 nm to 912 nm, is output from the pumping light source as described above. Here, the intensity change rate of the pumping light output from the pumping light source with respect to the temperature is denoted by ΔP dB/° C., the wavelength change rate of the pumping light output from the pumping light source with respect to the temperature is denoted by Δλp nm/° C., the pumping light absorption change rate of the rare earth-doped fiber per unit wavelength change at the wavelength of λ nm when the wavelength of the pumping light changes is denoted by A' (λ) dB/nm, and the pumping light absorption change amount of the rare earth-doped fiber per unit temperature change at the wavelength of λ nm when the temperature of the rare earth-doped fiber changes is denoted by ΔA (λ) dB/° C. Then, the wavelength λ of the pumping light in the fiber laser device according to the first comparative example is set to such a wavelength λ that ΔP, Δλp×A' (λ) and ΔA (λ) do not compensate with each other.

Next, the prepared fiber laser device of the first comparative example was made to output laser light and the environmental temperature of the fiber laser device was changed. The intensity change rate of the output light was measured using the intensity at an air temperature of 25° C. as a reference value. The results are shown in FIG. 6. As shown in FIG. 6, the results show that the output from the fiber laser device of the first comparative example varied largely due to the change in the environmental temperature.

Second Comparative Example

A fiber laser device was prepared similarly to that of the second example except that the pumping light source shown in FIG. 1 was similar to that of the first comparative example.

The intensity change rate ΔP of the pumping light output from the pumping light source with respect to the temperature and the wavelength change rate Δλp of the pumping light output from the pumping light source with respect to the temperature were measured. As a result, the following values were obtained:

$\Delta P = -0.0085$ [dB/° C.]

and $\Delta\lambda p = 0.35$ [nm/° C.], which were equal to those of the second example.

Since the rare earth-doped fiber of the second comparative example was the same as that of the second example, the absorption spectrum of the light (pumping light) incident to the rare earth-doped fiber was as shown in FIG. 7. In addition, the change in the absorption of the pumping light in the rare earth-doped fiber per unit temperature change with respect to the wavelength λ of the pumping light was as shown in FIG. 8. Further, the results of calculating the absorption of the pumping light in the rare earth-doped fiber in a case where the wavelength of the pumping light changed by 0.035 nm per unit temperature change and the absorption in the rare earth-doped fiber varied as shown in FIG. 8 were as shown in FIG. 9.

In the fiber laser device of the second comparative example, the pumping light having a wavelength of 920 nm, which does not fall within the range of about 925 nm to 950 nm, is output from the pumping light source as described above. Here, the intensity change rate of the pumping light output from the pumping light source with respect to the temperature is denoted by ΔP dB/° C., the wavelength change rate of the pumping light output from the pumping light source with respect to the temperature is denoted by Δλp nm/° C., the pumping light absorption change rate of the rare earth-doped fiber per unit wavelength change at the wavelength of λ nm when the wavelength of the pumping light changes is denoted by A' (λ) dB/nm, and the pumping light absorption change amount of the rare earth-doped fiber per unit temperature change at the wavelength of λ nm when the temperature of the rare earth-doped fiber changes is denoted by ΔA (λ) dB/° C. Then, the wavelength λ of the pumping light in the fiber laser device according to the second comparative example is set to such a wavelength λ that ΔP, Δλp×A' (λ) and ΔA (λ) do not compensate with each other.

Next, the prepared fiber laser device of the second comparative example was made to output laser light and the environmental temperature of the fiber laser device was changed. The variation rate of the intensity of the output light was measured using the intensity at an air temperature of 25° C. as a reference value. The results are shown in FIG. 10. As shown in FIG. 10, the results show that the output from the fiber laser device of the second comparative example varies largely due to the change in the environmental temperature.

As described above, with the fiber laser device of the invention, the gain variation can be sufficiently suppressed even when the temperature of the use environment changes. Therefore, it is believed that processing and measurement can be performed stably by using such a fiber laser device.

INDUSTRIAL APPLICABILITY

According to the invention, a fiber laser device capable of performing processing and measurement stably even when the temperature of the use environment changes is provided.

DESCRIPTION OF REFERENCE NUMERALS

10 . . . seed light source
11 . . . single mode fiber
20 . . . pumping light source
21 . . . laser diode
30 . . . optical coupler
40 . . . input double-clad fiber
41, 51, 61 . . . core
42, 52, 62 . . . clad
43, 53, 63 . . . plastic clad
50 . . . rare earth-doped fiber
60 . . . output double-clad fiber
100 . . . fiber laser device

The invention claimed is:

1. A fiber laser device comprising:
a pumping light source configured to output pumping light having a wavelength λ; and
a rare earth-doped fiber to which the pumping light is input and which has a core doped with a rare earth element that absorbs the pumping light, wherein
when an intensity change rate of the pumping light output from the pumping light source with respect to a temperature is denoted by ΔP dB/° C., a wavelength change rate of the pumping light output from the pumping light source with respect to the temperature is denoted by Δλp nm/° C., a pumping light absorption change rate of the pumping light in the rare earth-doped fiber per unit wavelength change at the wavelength of λ nm when the wavelength of the pumping light changes is denoted by A' (λ) dB/nm, and a pumping light absorption change amount of the rare earth-doped fiber per unit temperature change at the wavelength of λ nm when the temperature of the rare earth-doped fiber changes is denoted by ΔA (λ) dB/° C., the wavelength λ of the pumping light is such a wavelength λ that ΔP, Δλp×A' (λ) and ΔA (λ) compensate with each other.

2. A fiber laser device comprising:
a pumping light source configured to output pumping light having a wavelength λ; and
a rare earth-doped fiber to which the pumping light is input and which has a core doped with a rare earth element that absorbs the pumping light, wherein
when an intensity change rate of the pumping light output from the pumping light source with respect to a temperature is denoted by ΔP dB/° C., a wavelength change rate of the pumping light output from the pumping light source with respect to the temperature is denoted by Δλp nm/° C., a pumping light absorption change rate of the pumping light in the rare earth-doped fiber per unit wavelength change at the wavelength of λ nm when the wavelength of the pumping light changes is denoted by A' (λ) dB/nm, and a pumping light absorption change amount of the rare earth-doped fiber per unit temperature change at the wavelength of λ nm when the temperature of the rare earth-doped fiber changes is denoted by ΔA (λ) dB/° C., the wavelength λ of the pumping light satisfies:

$\Delta P + \Delta\lambda p \times A'(\lambda) + \Delta A(\lambda) = 0.$

3. The fiber laser device according to claim 1 or 2, wherein the rare earth element is ytterbium and the core is further doped with phosphorus.

\* \* \* \* \*